310-334
5/9/78 OR 4,088,915 SR

United States Patent [19] [11] 4,088,915
Kodama [45] May 9, 1978

[54] CURVED POLYMERIC PIEZOELECTRIC ELECTRO-ACOUSTIC TRANSDUCER

[75] Inventor: Akihiko Kodama, Tokorozawa, Japan

[73] Assignee: Pioneer Electronic Corporation, Tokyo, Japan

[21] Appl. No.: 708,283

[22] Filed: Jul. 23, 1976

Related U.S. Application Data

[63] Continuation of Ser. No. 552,140, Feb. 24, 1975, Pat. No. 4,008,408.

[30] Foreign Application Priority Data

Feb. 28, 1974 Japan .................................. 49/22866

[51] Int. Cl.[2] .............................................. H01L 41/04

[52] U.S. Cl. .................................... 310/334; 310/800; 179/110 A

[58] Field of Search .................. 310/8.5, 8.6, 9.1, 9.5, 310/9.6, 322, 324, 334, 357, 800; 179/110 A

[56] References Cited

U.S. PATENT DOCUMENTS

| | | | |
|---|---|---|---|
| 3,792,204 | 2/1974 | Murayama et al. | 310/8.3 X |
| 3,832,580 | 8/1974 | Yamamuro et al. | 310/9.5 |

*Primary Examiner*—Mark O. Budd
*Attorney, Agent, or Firm*—Blanchard, Flynn, Thiel, Boutell & Tanis

[57] ABSTRACT

An electro-acoustic transducer with a piezoelectric diaphragm supported by a support member having a curved portion for imparting a suitable resiliency and/or tension to said diaphragm to improve acoustic characteristics without reducing efficiency of the electro-mechanical conversion effected by the transducer.

6 Claims, 9 Drawing Figures

CURVED POLYMERIC PIEZOELECTRIC ELECTRO-ACOUSTIC TRANSDUCER

This is a continuation of application Ser. No. 552,140 filed Feb. 24, 1975, now U.S. Pat. No. 4,008,408 issued Feb. 15, 1977.

The present invention relates to a piezoelectric electro-acoustic transducer employing therein a diaphragm made of a piezoelectric film and provided with a resiliency and/or tension for vibration in the direction normal to the plane thereof.

More particularly, this invention is concerned with an improvement in a piezoelectric transducer in which the diaphragm is supported by a support member having a curved portion to impart a suitable resiliency and/or tension to said diaphragm supported by said support member, thereby improving acoustic characteristics without reducing efficiency in the vibration of said diaphragm.

It has been proposed to provide a piezoelectric electro-acoustic transducer employing as a diaphragm a thin film which has piezoelectricity. (For example, see U.S. Pat. No. 3,832,580.) Such a piezoelectric film to be used as a diaphragm for electro-acoustic transducer may be prepared by employing a high molecular weight polymer. (See: "Polypeptides Piezoelectric Transducers," by E. Fukuda et al., Sixth International Congress on Acoustics, D31, Tokyo, 1968 and "The Piezoelectricity of Poly(vinylidene Fluoride)," by H. Kawai, Japan, J. Appl. Phys. 8, 975, 1969).

In order to effectively convert an extension and contraction of such a diaphragm in a direction parallel to the plane thereof (caused by application of alternating current to the diaphragm) into a vibration in the direction normal to the plane of said diaphragm, it has been proposed to apply to the diaphragm on its one face a resilient backing member in a compressed state. However, such a resilient backing member tends to produce a mechanical resistance which is detrimental to a efficient vibration of the diaphragm (See, for example U.S. Pat. No. 3,832,580). In addition, according to variation of ambient conditions such as temperature, humidity, etc. over a long period of time, the resilient backing member becomes aged and loses its initial resiliency, thus unfavorably reducing the force which the resilient backing member exerts on the piezoelectric diaphragm. Accordingly, with the conventional device, it is difficult to obtain and keep excellent properties in respect of acoustic characteristics such as transducing efficiency, frequency characteristics, etc.

The present inventor has made intensive and extensive study and as a result, the present invention has been made to overcome the drawbacks described in the foregoing.

It is therefore an object of the present invention to provide a piezoelectric electro-acoustic transducer in which mechanical resistance caused by a resilient backing member abutting against a piezoelectric diaphragm can be minimized without reducing a transducing efficiency, frequency characteristics, etc.

Essentially, according to the present invention, there is provided a piezoelectric electro-acoustic transducer employing therein a piezoelectric diaphragm supported at its edge portions by a support member having a portion curved to impart at least one of resiliency and tension to said piezoelectric diaphragm.

The invention will be better understood from the following description taken in connection with the accompanying drawings in which.

In the drawings and the following descriptions, like portions or parts are denoted by like numerals or characters.

Figure 1:
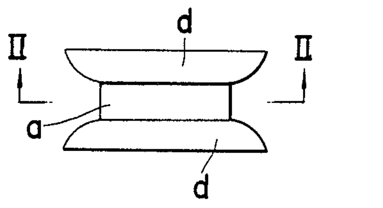
Fig. 1 Prior art
FIG. 1 is a side view showing a conventional piezoelectric electro-acoustic transducer.
Figure 2:
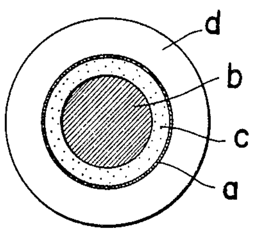
Fig. 2 Prior art
FIG. 2 is a cross sectional view of FIG. 1 taken along the line II — II.

In FIGS. 1 and 2, there is shown a conventional transducer wherein a resilient backing member *c* is fitted around the periphery of a cylindrical body *b* and further, around the periphery of said resilient backing member *c* is fitted a piezoelectric diaphragm *a* to press the resilient body *c* radially inwardly. On both ends of said cylindrical body *b*, there are fixed supporting plates *d* which are of rigid material. When an alternating current is applied to said piezoelectric diaphragm *a*, the piezoelectric diaphragm *a* alternately expands and contracts along the periphery thereof. Accordingly, said piezoelectric diaphragm vibrates in a radial direction.

Figure 3:
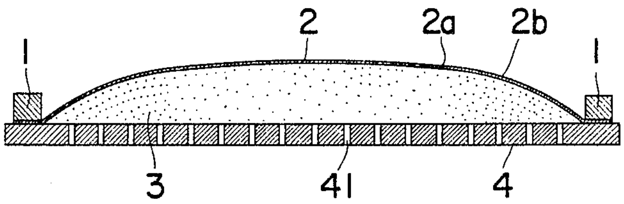
Fig. 3 Prior art
FIG. 3 is a vertical cross sectional view of another type of conventional piezoelectric electro-acoustic transducer.

There is shown another conventional piezoelectric transducer in FIG. 3, wherein a resilient backing member 3 is provided on a base plate 4 which has a plurality of pores having a predetermined configuration and a predetermined size. A piezoelectric diaphragm 2 is fitted over said resilient backing member 3 and both ends of said diaphragm 2 are fixed onto the base plate 4 by supporting members 1. As a result of the above, said resilient backing member 3 exerts a pressure on the diaphragm 2. When an alternating current is applied to said diaphragm 2, the diaphragm 2 alternately expands and contracts in the direction along the plane thereof. Therefore, said piezoelectric diaphragm 2 vibrates in the direction normal to the plane of said diaphragm 2.

The conventional piezoelectric electro-acoustic transducers of such structure have disadvantages as described in the foregoing.

Figure 4:
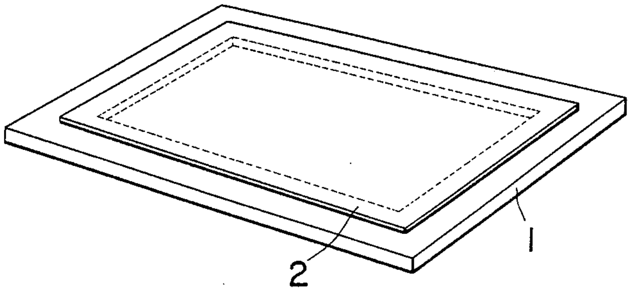
FIG. 4 is a perspective view of an assembly of a support member and a piezoelectric diaphragm fixedly supported thereby, showing the state in which the curved configuration of the support member according to the present invention is not yet made.

Referring to FIG. 4, there is shown an assembly of a support member and a piezoelectric diaphragm fixedly supported thereby. Numeral 1 designates a support member made of a rigid material such as metal or rigid plastic. Numeral 2 designates a diaphragm made of a thin film of a high molecular weight polymer material such as polyvinylidene fluoride ($PVF_2$), polyvinyl fluoride (PVF), polyvinyl chloride (PVC), nylon-11 or polypeptide (PMG) or the like.

Figure 5:
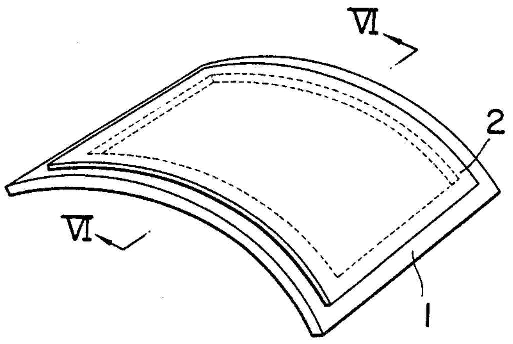
FIG. 5 is a perspective view of one embodiment of the present invention.

Referring now to FIG. 5, there is shown one embodiment of the present invention, which is prepared by curving the assembly shown in FIG. 4 as depicted or by curving two opposite sides of a support member 1 beforehand and then fixedly attaching a piezoelectric diaphragm 2 at its edge portion to the support member 1 as depicted.

Figure 6:
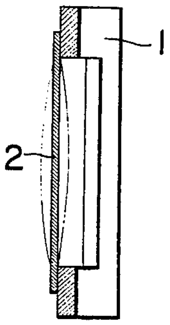
FIG. 6 is a cross sectional view of FIG. 5 taken along the line VI — VI.

Referring to FIG. 6, there is shown a cross sectional view of FIG. 5. The piezoelectric diaphragm 2 is adapted to vibrate between the realm defined by two-dot chain lines.

Figure 7:
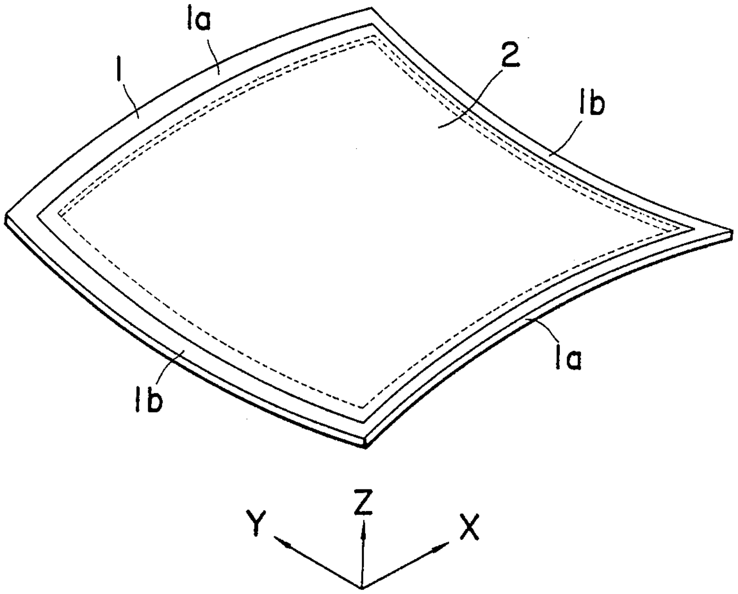
FIG. 7 is a perspective view of another embodiment of the present invention.

Referring to FIG. 7, there is shown another embodiment of the present invention, wherein numeral 1 designates a support member made of a rigid material such as metal or rigid plastics and having sides 1*a* extending along an X-axis and sides 1*b* extending along a Y-axis as depicted. The sides 1*a* and the sides 1*b* are curved in the reverse directions along a Z-axis. Illustratively stated, the sides 1*a* are curved upwardly while the sides 1*b* are curved downwardly. Numeral 2 designates a diaphragm made of a thin film of high molecular weight polymer material as mentioned before. When the diaphragm 2 is fixedly attached at its edge portions to the support member 1, it is caused to have a configuration like a saddle.

Figure 8:
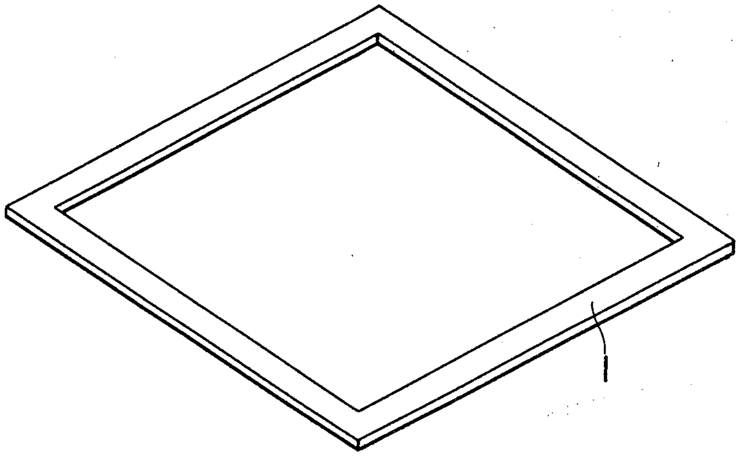
FIG. 8 is a perspective view of a support member to be curved.
Figure 9:
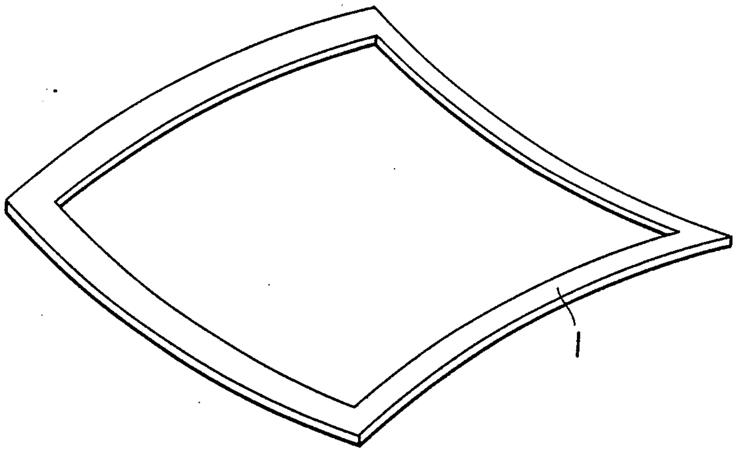
FIG. 9 is a perspective view of the support member of FIG. 8 curved in the form of saddle.

Referring to FIGS. 8 and 9, there are respectively shown a support member 1 before and after it is subjected to working for obtaining a curved configuration. As similar to the case of the diaphragm assembly of FIG. 5, there may be two methods of manufacturing the saddle type piezoelectric diaphragm assembly shown in FIG. 7. One of the methods consists in subjecting the support member 1 as shown in FIG. 8 to a working for obtaining a curved configuration after a diaphragm is fixedly attached to the flat support member 1. The other method consists in subjecting a support member 1 to a working to obtain a curved configuration as shown in FIG. 9 and then fixedly attaching at its edge portions a diaphragm to the support member 1.

In any of the embodiments described in the foregoing, the support member is rectangular, the four sides of the support member are made integral, and the curved sides are curved symmetrically in relation to the middle thereof. These points, however, are not essential in the piezoelectric diaphragm assembly of the electro-acoustic transducer according to the present invention. Illustratively stated, the support member may be square or annular, sides of the support member are not necessarily made integral, and the curving is not necessarily made symmetrical. Further, it is to be noted that even if a curvature is provided only in one portion of the support member, the object intended by the present invention can be attained to some extent.

In operation, when an alternating current is applied to the diaphragm 2, the diaphragm 2 alternately expands and contracts. Since the diaphragm 2 is curved according to the curvature of the support member 1, the expansion and contraction is converted into vibration as shown by two-dot chain lines in FIG. 6. With this structure, a resilient backing member is not necessarily needed for converting the expansion and contraction of the diaphragm 2 into vibration thereof.

In this way, it is possible minimize the mechanical resistance usually caused by a resilient backing member abutting against a diaphragm without reducing the transducing efficiency, frequency characteristics, etc. Consequently, acoustic characteristics of the piezoelectric electro-acoustic transducer are much improved with the present invention.

What is claimed is:

1. A piezoelectric electro-acoustic transducer, comprising:

a flexible piezoelectric diaphragm;

a rigid endless framelike support member surrounding an opening therethrough spanned by said diaphragm, said endless framelike support member being nonplanar and including a portion along its length which is curved generally in the direction of the axis of said opening, the perimetral edge of said diaphragm being attached to said endless framelike support member and following the curvature of said portion thereof, the surface of said flexible diaphragm being correspondingly curved to a nonplanar condition solely by its perimetral edge attachment to said rigid nonplanar framelike support member so as to impart at least one of tension and resiliency to said diaphragm.

2. A transducer according to claim 1, wherein said support member comprises four sides forming a quadrilateral, the four sides including a pair of opposite sides each rigidly curved to render said support member nonplanar.

3. A transducer according to claim 2, wherein said pair of opposite sides are curved symmetrically in relation to the middle thereof.

4. A piezoelectric electro-acoustic transducer, comprising:

a flexible piezoelectric diaphragm;

a rigid endless framelike support member surrounding an opening therethrough spanned by said diaphragm, said endless framelike support member being nonplanar and including a portion along its length which is curved generally in the direction of the axis of said opening, the perimetral edge of said diaphragm being attached to said endless framelike support member and following the curvature of said portion thereof, the surface of said flexible diaphragm being correspondingly curved to a nonplanar condition solely by its perimetral edge attachment to said rigid nonplanar framelike support member so as to impart at least one of tension and resiliency to said diaphragm, wherein said support member comprises four sides with one pair of opposite sides curved to render said support member nonplanar and said four sides include a further pair of opposite sides which are also rigidly curved.

5. A transducer according to claim 1, in which said rigid endless framelike support member is a quadrilateral frame, two opposed sides of which are substantially coplanar, the remaining two sides of said quadrilateral frame being solely responsible for the nonplanar condition of said flexible diaphragm and being curved out of the common plane of the first mentioned two sides of said frame, said remaining two sides of said frame being the said curved portions of said support member, said remaining sides of said frame being rigid and fixedly supporting the adjacent side edges of said flexible diaphragm imparting to said flexible diaphragm a stable three-dimensional rest shape, said diaphragm being unbacked throughout its central portion and backed only by its perimetral edge connection to the sides of said rigid frame.

6. A piezoelectric electro-acoustic transducer, comprising:

a rigid semicylindrical support member substantially of semicircular cross section;

a flexible piezoelectric diaphragm tensioned over the surface of said support member, the perimeter of the diaphragm being substantially coextensive with the perimeter of said support member and being fixedly secured thereto and holding the flexible diaphragm at least somewhat tensioned on the support member, said flexible diaphragm thereby taking on the semicylindrical, substantially semicircular cross section shape of said support member, the center portion of said support member being absent leaving an opening therethrough behind said flexible diaphragm and conforming generally in outline and approaching in area said diaphragm, such that the major and central area of the diaphragm is unbacked and unrestrained in movement substantially normal to its surface in transducer use except by said connection of its perimeter to the nonplanar frame, the three-dimensional shape of the diaphragm being defined solely by the nonplanar shape of the perimeter of said support member;

the nonplanar shape being imparted to the flexible diaphragm without need for a separate resilient backing member pressed against such diaphragm and without need for stiffening of the diaphragm sufficiently to make it self-supporting in a curved condition at rest.

* * * * *

UNITED STATES PATENT OFFICE

CERTIFICATE OF CORRECTION

Patent No. 4,088,915 Dated May 9, 1978

Inventor(s) Akihiko Kodama

It is certified that error appears in the above-identified patent and that said Letters Patent are hereby corrected as shown below:

The term of this patent subsequent to February 15, 1994 has been disclaimed.

Signed and Sealed this

***Fourteenth* Day of *November 1978***

[SEAL]

*Attest:*

RUTH C. MASON
*Attesting Officer*

DONALD W. BANNER
*Commissioner of Patents and Trademarks*